(12) United States Patent
Sugiyama

(10) Patent No.: US 6,437,330 B1
(45) Date of Patent: Aug. 20, 2002

(54) METHOD AND APPARATUS FOR ADJUSTING A CHARGED PARTICLE BEAM OF A BEAM OPTICAL SYSTEM

(75) Inventor: Yasuhiko Sugiyama, Chiba (JP)

(73) Assignee: Seiko Instruments, Inc., Chiba (JP)

( * ) Notice: Subject to any disclaimer, the term of this patent is extended or adjusted under 35 U.S.C. 154(b) by 0 days.

(21) Appl. No.: 09/360,338

(22) Filed: Jul. 26, 1999

(30) Foreign Application Priority Data

Jul. 27, 1998 (JP) .......................................... 10-211222

(51) Int. Cl.$^7$ ................................................. H01J 37/26
(52) U.S. Cl. ........................................ 250/309; 250/310
(58) Field of Search ................................ 250/309, 310, 250/307, 397, 396 R, 396 ML

(56) References Cited

U.S. PATENT DOCUMENTS

| | | | | |
|---|---|---|---|---|
| 3,748,467 A | * | 7/1973 | Suganuma | 250/49.5 |
| 4,162,403 A | * | 7/1979 | Baumgarten | 250/396 ML |
| 4,392,054 A | * | 7/1983 | Sato et al. | 250/307 |
| 5,032,725 A | * | 7/1991 | Kanda | 250/307 |
| 5,130,540 A | * | 7/1992 | Yamada et al. | 250/310 |
| 5,198,668 A | * | 3/1993 | Yamada | 250/310 |
| 5,659,174 A | * | 8/1997 | Kaneoka et al. | 250/310 |
| 6,177,670 B1 | * | 1/2001 | Sugiyama | 250/307 |

* cited by examiner

Primary Examiner—Kiet T. Nguyen
(74) Attorney, Agent, or Firm—Pillsbury Winthrop LLP

(57) ABSTRACT

A method and apparatus for obtaining an observational image of a sample surface by scanning a charged particle beam to detect secondary charged particles given off from the sample surface. Charged particle beam focusing and astigmatism correction are performed by comparing scanning images: one image obtained from an initial adjusting value, and other images obtained from a ±Δ of the initial adjusting value, wherein Δ is a known predetermined selected value. The clearest image of the images is selected, and the adjusting value of the clearest image is then set as the new initial adjusting value. The entire scanning, comparison, and adjusting process is repeated until an optimal satisfactory image is obtained.

7 Claims, 5 Drawing Sheets

(Sx−ΔSx, Sy+ΔSy)     (Sx, Sy+ΔSy)     (Sx+ΔSx, Sy+ΔSy)

(Sx−ΔSx, Sy)     (Sx, Sy)     (Sx+ΔSx, Sy)

(Sx−ΔSx, Sy−ΔSy)     (Sx, Sy−ΔSy)     (Sx+ΔSx, Sy−ΔSy)

f+Δf           f           f−Δf (Sx−ΔSx, Sy+ΔSy)   (Sx, Sy+ΔSy)   (Sx+ΔSx, Sy+ΔSy)

(Sx−ΔSx, Sy)   (Sx, Sy)   (Sx+ΔSx, Sy)

(Sx−ΔSx, Sy−ΔSy)   (Sx, Sy−ΔSy)   (Sx+ΔSx, Sy−ΔSy)

METHOD AND APPARATUS FOR ADJUSTING A CHARGED PARTICLE BEAM OF A BEAM OPTICAL SYSTEM

BACKGROUND OF THE INVENTION

The present invention relates to an adjusting method and apparatus for a beam optical system in a scanning microscope that scans and irradiates a charged particle beam to a sample surface and detects emitted secondary charged particles to obtain an observational image. More particularly, the present invention relates to a method and apparatus suited for adjusting a focus correction and an astigmatism correction of a focused ion beam microscope.

The existence of scanning ion microscopes (SIM) and electron microscopes for use as high-magnification microscopes is widely known. Although similar in principle to scanning electron microscopes (SEM), scanning ion microscopes are significantly different in that ions, instead of electrons, are irradiated as a beam to a sample surface, and in that secondary charged particles given off from the sample surface are not limited to only electrons, but include ions as well. Because of the difference in the secondary charged particles given off in using SEM's and SIM's, the scanning images also differ in resolution depending on the different types of sample materials being scanned. Accordingly, it is a common practice to select an ion beam microscope when the SIM image is clearer than that of a SEM image for a particular type of sample being examined. Both SEM and SIM images may also be obtained to compare both of the scanned images to enable further detailed observation.

The focused ion beam apparatus has been in use in the semiconductor manufacturing field for about ten years. However, there has been some recent developments in the basic performance of the ion beam optical system. The high-brightness and high-resolution powered systems have become observational microscopes, while the high-accuracy systems have become processing apparatuses used to form and shape the samples.

The scanning microscope operates by using a charged particle beam irradiated onto a sample surface. Secondary charged particles are driven out of the sample surface in the irradiated area. By detecting the secondary charged particles, image information for that area can be obtained. Accordingly, if the beam is spread out and irradiated onto the sample surface, the image information obtained would cover a broader area. When the beam is spread out, the beam energy per unit area is decreased, and the secondary charged particles given off in that particular area are also reduced. Consequently, the image obtained is low in resolution and contrast (signal power/brightness). Also, if the beam is in an elliptical form at a certain direction, that is, oval as opposed to being circular, the area of irradiation will also be elliptical, and the scanned image will have a difference in resolution in that direction, resulting in an image that appears to "flow" in that direction with loss of resolution. Therefore, in order to obtain an image with even clarity in every direction, it is required to create a beam that is circular when projected onto the sample surface (that is, circular in sectional form) and which is well-focused onto the sample surface.

A focus adjustment for a scanning microscope of this kind using charged particles has been conventionally available. There is also disclosure in a publication, JP-B-4-40825, of an automatic focus adjusting method for an electron microscope, or the like. This publication teaches one how to perform focus adjustment by sequentially varying a current flowing to an objective lens, while taking scanning images in order to search for the highest point in the detection signal level of the secondary charged particles using a peak detector. When a beam is restricted and irradiated onto a sample surface, the number of secondary charged particles emitted would be high. Therefore, by varying the current flowing to an objective lens and detecting the number of secondary charged particles emitted, the peak level may be detected and automatically set.

Consistent focus adjustment can only be made if the strength of the irradiated beam and the correspondence of the secondary charged particles emitted were always the same. But, it is not possible to perform the desired automatic focus adjustment due to the "aging" of the sample. That is, when a focused ion beam is irradiated onto a semiconductor device with a passivation film, a phenomenon is exhibited where in an initial stage of irradiation, the amount of secondary charged particles is great and the image is bright. But, if the scanning is repeated several times, the image may become darker, and then become brighter again. The difference in the intensity of the images is due to the variable amount of secondary charged particles in the sample surface at any given time, even though the strength of the beam is constant. The variance in the number of secondary charged particles makes automatic focusing mechanisms difficult to operate. Moreover, correction of distortions in the beam sectional form, i.e., adjusting for astigmatism correction, requires an adjustment operation skill that simply cannot be performed by a novice operator.

The present invention aims to provide an adjusting method for a charged particle beam optical system that enables focus adjustment that is unaffected by the irradiation beam intensity and the variable nature of the number of secondary charged particles being emitted at any point during irradiation of a sample surface. The method of the present invention allows even a beginner to make focus adjustments, including astigmatism corrections, with less operator training required than in the prior methods.

SUMMARY OF THE INVENTION

The present invention relates to a method and apparatus for obtaining an observational image of a sample surface by scanning a charged particle beam to detect secondary charged particles given off from the sample surface. Charged particle beam focusing and astigmatism correction are performed by comparing scanning images: one image obtained from an initial adjusting value, and other images obtained from a $\pm\Delta$ of the initial adjusting value, wherein $\Delta$ is a predetermined selected value. The clearest image of the images is selected, and the adjusting value of the clearest image is then set as the new initial adjusting value. The entire scanning, comparison, and adjusting process is repeated until an optimal satisfactory image is obtained.

In performing focus correction in the present invention, focusing a beam with a lens of an optical system occurs by varying the power provided to the lens in order to focus the beam onto a sample surface. If the charged particle beam is a focused ion beam, then the intensity of the electric field applied is varied by the power setting of an electrostatic lens (by varying the applied voltage to the lens). If the beam is an electron beam, then the lens power setting (of an electromagnetic lens) is varied by the current supplied to the coil to vary the intensity of the magnetic field. By varying the lens power settings, a focal point f may be changed by $\pm\Delta f$, and the scanning images obtained at f, $f+\Delta f$, and $f-\Delta f$ may be stored in an image memory, and these three images may be displayed for comparison. It is preferable that these three images are all displayed at the same time, so that direct comparison of these three images may be made by the operator.

If the clearest image of the three is not the image obtained at f, then a new focal point f is shifted by +Δf or Δf, corresponding to the adjustment distance of the clearest image selected. Then, the entire scanning and comparison process may be repeated, and a new Δf may be selected as well, preferably a smaller Δf value then the previous value selected (such as one-half of the Δf previously used) in order to perform a more precise (fine) adjustment. The process is repeated until an optimal image is obtained, and thus an optimal focal distance is also obtained.

The present invention also allows for astigmatism correction adjustment. Astigmatism in a scanned image occurs as a result of a circular-shaped beam spot becoming oval-shaped. For example, the beam spot may become oval-shaped so that it has a wider diameter in the horizontal direction. When the beam spot is oval and has a wider diameter in the horizontal direction, the beam irradiation becomes more spread out, and the beam irradiation in the vertical direction becomes more narrow. Accordingly, the image information has a lower resolution in the horizontal direction (because the beam intensity is spread out more), and the image information has a higher resolution in the vertical direction (because the beam intensity is more narrow or concentrated). Therefore, in order to obtain an even image all around, it is necessary to adjust the beam spot to form a circular shape. This adjustment is performed by a stigmator of the beam optical system.

The astigmatism adjustment is performed by displaying a plurality of images, one with an initial adjustment value, and then several images having a selected difference or adjustment value from the initial adjustment value. The images are preferably displayed all at once and are visually compared by the operator to select the most even and clearest image from the plurality of images displayed. Because of the nature of correcting an astigmatic focused beam sectional shape into a circular shape, a two-dimensional adjustment is required, which is different than that of the focal adjustment, which only requires a single direction adjustment. Therefore, there are preferably nine images displayed all at the same time, one image scanned from the initial adjustment value, and the remaining eight images scanned from the initial adjustment value in a Δ amount in the two directions.

FIG. 7 illustrates a stigmator comprised of an electrode arrangement of an eight-pole astigmatism corrector according to an embodiment of the present invention. By applying voltages to four electrodes A1, A2, A3, and A4, astigmatism correction may be performed in a first direction. By applying voltage to four electrodes B1, B2, B3, and B4, astigmatism correction may be performed in a second direction. In this arrangement, a two-dimensional beam adjustment may be performed.

As illustrated in FIG. 2, images are scanned with a first directional adjustment in a predetermined amount of ±ΔSx from the initial adjustment value, and the images are also scanned with a second directional adjustment in a predetermined amount of ±ΔSy from the initial adjustment value. Therefore, a total of nine images are scanned and displayed, based on each combination of ±ΔSx and ±ΔSy from the initial adjustment value, including the image scanned from the initial adjustment value.

As shown in FIG. 2, the scanned images having the following adjustments are preferably arranged in the following order in a three-by-three grid-like manner: (1) top row, left image: Sx−ΔSx, Sy+ΔSy; (2) top row, center image: Sx, Sy+ΔSy; (3) top row, right image: Sx+ΔSx, Sy+ΔSy; (4) center row, left image: Sx−ΔSx, Sy; (5) center row, center image:. Sx, Sy; (6) center row, right image: Sx+ΔSx, Sy; (7) bottom row, left image: Sx−ΔSx, Sy−ΔSy; (8) bottom row, center image: Sx, Sy−ΔSy; and (9) bottom row, right image: Sx+ΔSx, Sy−ΔSy.

The most even and clearest image from among the nine images is selected, and a new initial adjustment value (Sx, Sy) is selected based on the most even and clearest image selected (that is not the center image having the original initial adjustment value). The astigmatism adjustment process may be repeated until the center image is the most even and clearest image, and new ΔSx and ΔSy amounts may be selected (preferably being values smaller than the ΔSx and ΔSy amounts used in the previous adjustment) to perform a more precise (fine) adjustment.

DETAILED DESCRIPTION OF THE INVENTION

Figure 3:
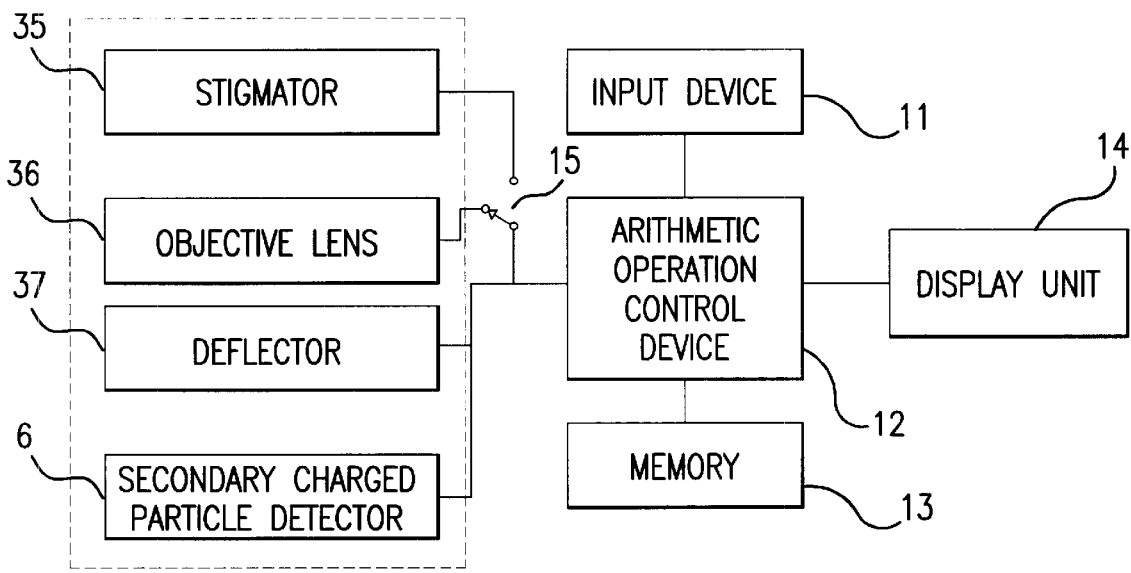
FIG. 3 illustrates a block diagram of the structures of an apparatus according to an embodiment of the present invention.
Figure 4:
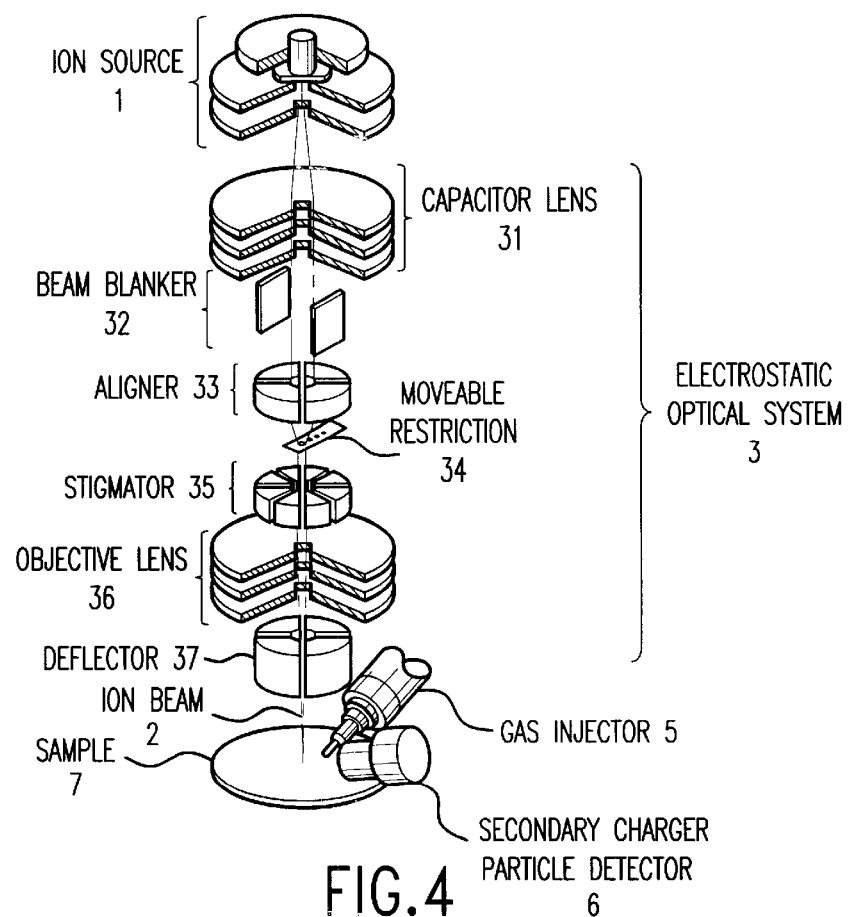
FIG. 4 illustrates an example of a scanning ion microscope according to an embodiment of the present invention.

An embodiment of the present invention will be described with reference to FIGS. 3 and 4. The section encompassed by the broken lines in FIG. 3 shows a main body of the focused ion beam apparatus. FIG. 4 illustrates the main components of an electrostatic optical system 3 of the focused ion beam apparatus as comprising a capacitor lens 31, a beam blanker 32, an aligner, 33, a moveable restriction 34, a stigmator 35, an objective lens 36, and a deflector 37. The stigmator 35 is used for adjusting astigmatism, the objective lens 36 is for adjusting a focal distance, the deflector 37 is for scanning a beam 2, and a secondary charged particle detector 6 is for detecting the secondary charged particles given off from a sample surface 7. The beam 2 is emitted from the ion source 1. An input device 11, such as a keyboard, is attached to an arithmetic operation control device 12 for driving and controlling the focused ion beam apparatus. A memory 13 is used for storing the images, data, and programs of the apparatus, and the apparatus also has a display unit 14. A switch 15 is used to change between the operation of a focal or an astigmatism adjustment.

The memory 13 has a ROM stored with an optical system adjusting program that is adapted to select a focus adjustment execution mode or an astigmatism adjustment execution mode. This program is configured so that an adjustment operation can proceed according to an operation procedure while displaying a selection/setting menu screen on the display 14.

Figure 5:
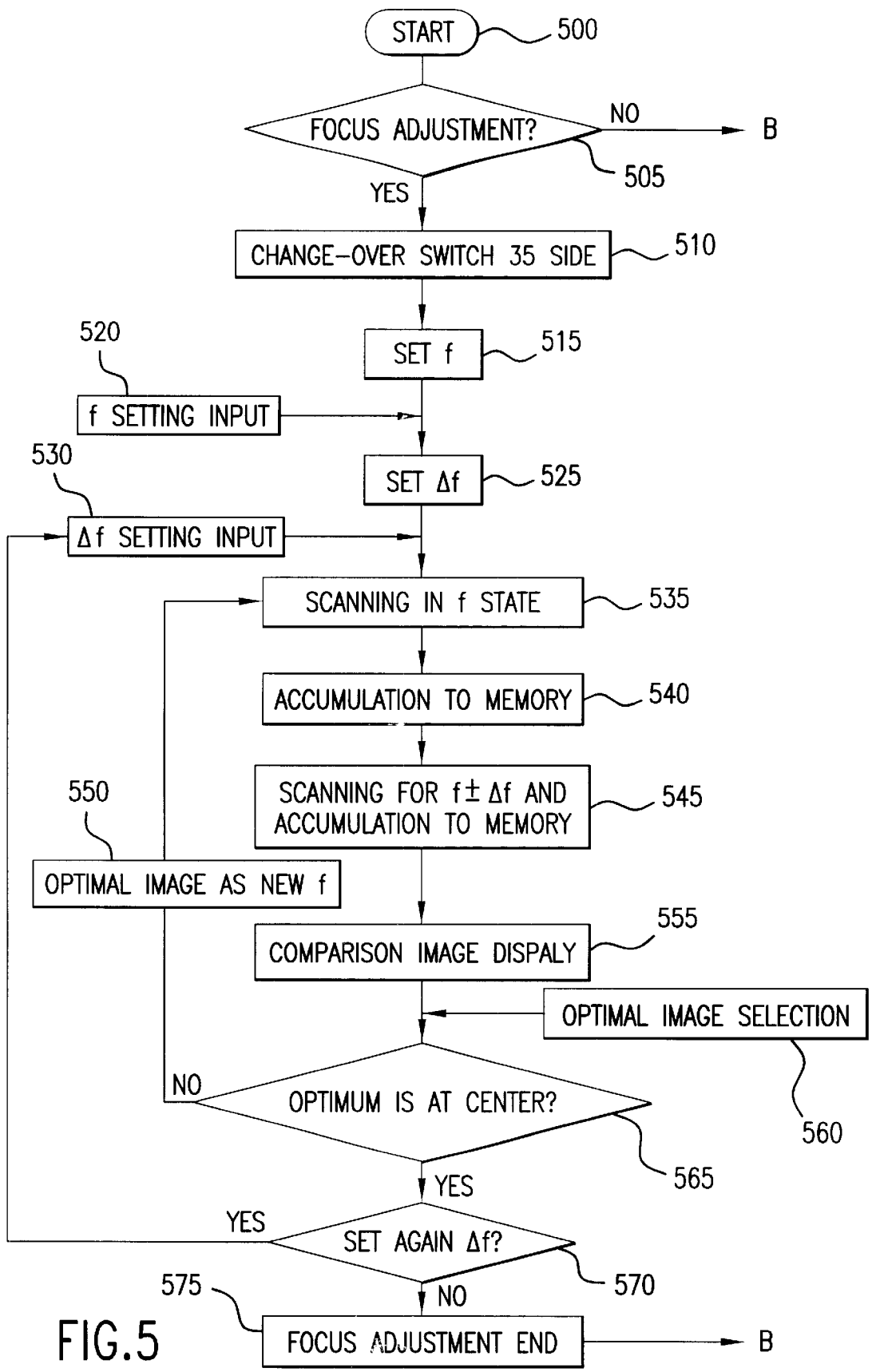
FIG. 5 illustrates a flow chart showing an operation of the focus adjustment according to an embodiment of the present invention.
Figure 6:
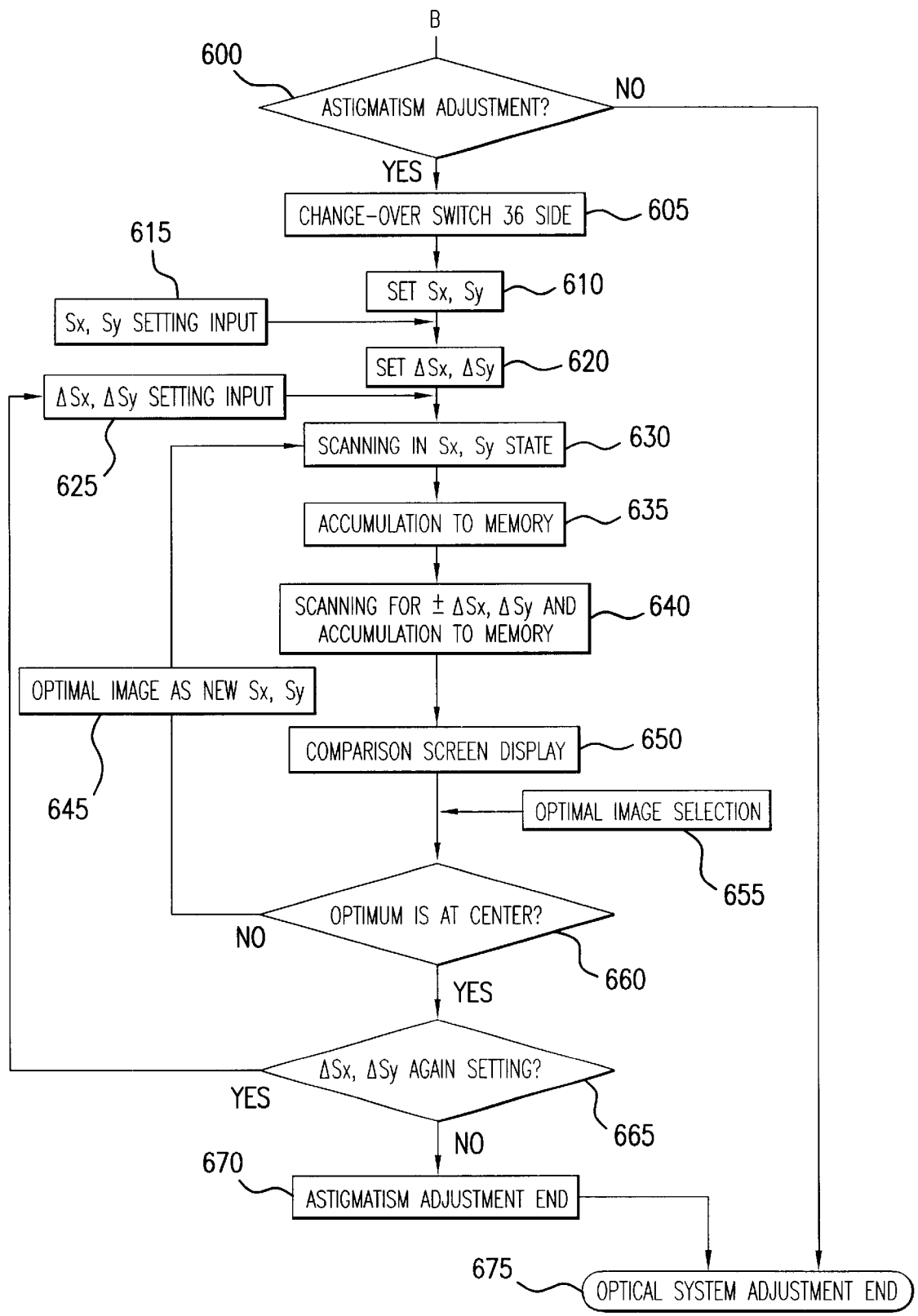
FIG. 6 illustrates a flow chart showing an operation of the astigmatism adjustment according to an embodiment of the present invention.
Figure 7:
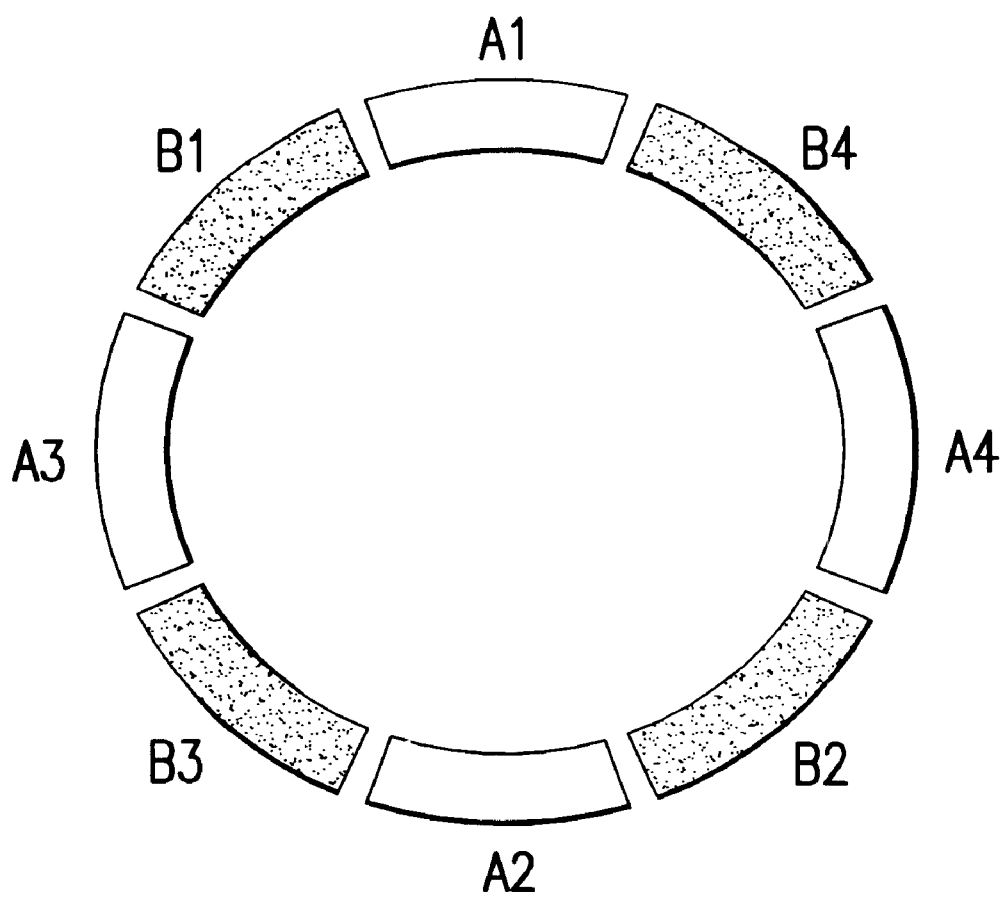
FIG. 7 illustrates a stigmator comprised of an electrode arrangement of an eight-pole astigmatism corrector according to an embodiment of the present invention.

The flow of operation for the focus adjustment will be explained with reference to FIG. 5, and the flow of operation for the astigmatism adjustment will be explained with reference to FIG. 6. First, if focus adjustment is selected at step 505, the change-over switch 15 is selected at step 510 to connect to the objective lens 36 so that an adjusting control amount from the arithmetic operation control device 12, such as a computer, can be sent to the objective lens 36. At step 515, an inquiry as to what value of the initial value f, of the focal distance, is made. If an estimate is made, the value may be entered from the input device 11 (keyboard), as in step 520. When no estimate is made or entered, the current value of the apparatus is selected as the initial value. Next at step 525, an inquiry as to the value of an adjusting distance, $\Delta f$, is made. It is advisable to initially set a larger $\Delta f$ so that a proper adjusting value range may be obtained faster. Once $\Delta f$ is set, a drive signal is given from the arithmetic operation control device 12 to the deflector 37. After taking a scanning image with the initial setting value as a focal distance at step 535, the objective lens 36 is adjusted to take scanning images with the focal distance shifted by $\pm \Delta f$ therefrom (that is, taking two images) at step 545. The three scanning images are written into the RAM of the memory 13, as in steps 540 and 545. The adjusting control amount required for shifting the focal distance $-\Delta f$ is calculated by the arithmetic operation control device 12. The focal distance is adjusted by $-\Delta f$ by application of the adjustment control value to the objective lens.

Figure 1:
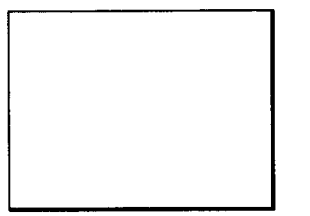
FIG. 1 illustrates examples of displays used when performing focus adjustment according to an embodiment of the present invention.
Figure 1:
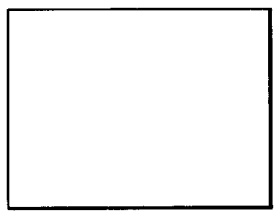
Figure 1:
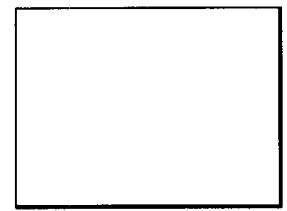

In the next step 555, the three scanning images are arranged and displayed on the display 14, and an inquiry is made as to which of the three images is clearest. The operator may make a selection while looking at the three images on the display 14, as in step 560. Preferably, the images are displayed in an arrangement so that the $f+\Delta f$ image is on the left, the focal point f image is in the center, and the $f-\Delta f$ image is on the right (as shown in FIG. 1). If the clearer image is the $f+\Delta f$ image or the $f-\Delta f$ image, then the focal distance is shifted by $\pm \Delta f$ corresponding to the focal distance of the selected image so as to set a new focal distance value f, as in step 550. The process is repeated until the center image is the clearest image among the three images. When the center image is the clearest image as at step 565, the focal distance adjustment to reach the clearest image possible is within one-half of $\Delta f$. Then, the $\Delta f$ may be selected at step 570 with a smaller value in order to perform a more precise (fine) adjustment to narrow the optimal focal distance. The focal adjustment process may be repeated with different $\Delta f$ values, using the steps described above, until the image becomes satisfactory. Once the focal distance adjustment is completed, the operator ends the focal adjustment process, preferably by entering "pass", or the like, on the input device 11, at step 575.

Figure 2:
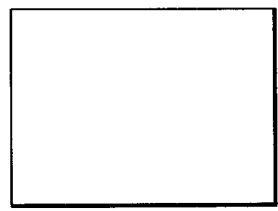
FIG. 2 illustrates examples of displays used when performing astigmatism adjustment according to an embodiment of the present invention.
Figure 2:
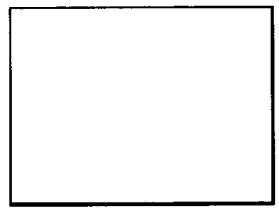
Figure 2:
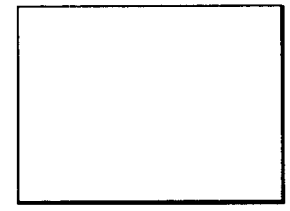
Figure 2:
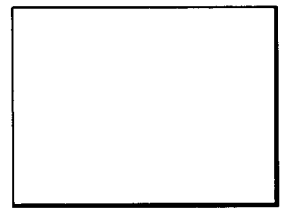
Figure 2:
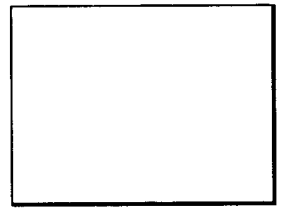
Figure 2:
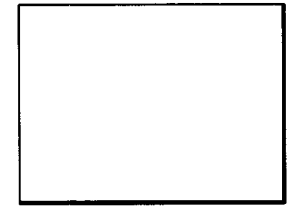
Figure 2:
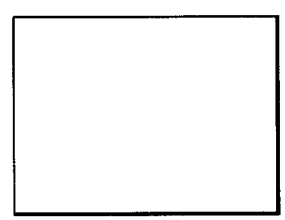
Figure 2:
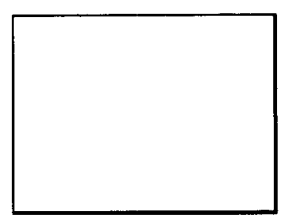
Figure 2:
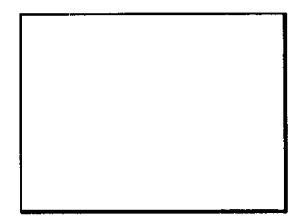

After performing the focus adjustment, an inquiry as to whether an astigmatism adjustment is to be performed is made. The flow of operation for the astigmatism adjustment will be explained with reference to FIG. 6. If astigmatism adjustment is to be made, the operator inputs "Yes", or the like, on the input device 11, as in step 600. If "No", or the like, is selected, the adjustment program for the beam optical system ends at step 675. If astigmatism adjustment is to be made, the switch 15 is selected 605 to connect with the stigmator 35 so that an adjusting control amount from the arithmetic operation control device 12 can be sent to the stigmator 35. Next, similar to the focus adjustment, an inquiry as to the initial settings for the first direction and the second direction (Sx, Sy) is made at step 610. If estimation is possible, the values may be inputted through the input device 11 (keyboard) to set the initial values, as in step 615. If estimation is not possible, then, the current values set on the apparatus are set as the initial values. Then, the adjusting values for $\Delta Sx$ and $\Delta Sy$ for a first and second direction, respectively, are requested at step 620. These adjusting values $\Delta Sx$ and $\Delta Sy$ are also entered through the input device 11. Initially, the adjusting values $\Delta Sx$ and $\Delta Sy$ may be large so that a proper adjusting value range may be quickly obtained. Once the adjusting values $\Delta Sx$ and $\Delta Sy$ are made, a scanning image is taken with the initial settings of the Sx and Sy values at step 630. Then, the stigmator 35 is adjusted to take a scanning image with the adjusting amount varied by $\pm \Delta Sx$ in the first direction, and $\pm \Delta Sy$ in the second direction at step 640. Thus, a total of 9 scanning images are captured and stored into the RAM of the memory 13, as in steps 635 and 640. The adjustment control amount required to shift the astigmatism by $\pm \Delta Sx$ in the first direction and $\pm \Delta Sy$ in the second direction is calculated by the arithmetic operation control device 12. By applying the adjustment control amount to the stigmator 35, the astigmatism adjusting amount is adjusted by $\pm \Delta Sx$ in the first direction and $\pm \Delta Sy$ in the second direction. In the next step 650, preferably, the nine scanned images are arranged and displayed on the display 14 for comparison. Next, an inquiry is made as to which of the nine images is the most even and clearest image at step 655. The operator makes a selection after observing the images on the display 14. The images are preferably arranged in a three-by-three grid-like manner on the display 14, as shown in FIG. 2. The image of the initial Sx and Sy position is preferably the center-most image; an image reduced by $\Delta Sx$ in the first direction adjusting amount is preferably on the left of the center image; an image enlarged by $\Delta Sx$ in the first direction is preferably on the right of the center image; an image enlarged by $\Delta Sy$ in the second direction adjusting amount is preferably above the center image; and an image reduced by $\Delta Sy$ in the second direction adjusting amount is preferably below the center image.

If the most even and clearest image selected is one other than the center-most image, then the astigmatism adjusting amount of the selected image is selected as the new initial position (Sx, Sy), as in step 645. The astigmatism adjusting process described above is repeated until the center-most image is the most even and clearest image as determined at step 660. When the center image is the most even and clearest image, the astigmatism adjustment required to reach the clearest image possible is within one-half of $\Delta Sx$ and one-half of $\Delta Sy$. A new $\Delta Sx$ value and $\Delta Sy$ value may be selected at step 665 with smaller values than the ones used in the previous adjustment in order to perform a more precise (fine) adjustment. The astigmatism adjustment process may be repeated with different $\Delta Sx$ and $\Delta Sy$ values, using the steps described above, until the image becomes satisfactory. Once the astigmatism adjustment process is completed, the operator ends the astigmatism adjustment process, preferably entering "pass", or the like, on the input device 11, at step 670.

As described above, because focal adjustment and astigmatism adjustment is performed by comparing the images on a display screen, the operator only needs to visually compare and select the best images, and therefore, the skill required to manually and delicately operate adjustments of a scanning microscope is no longer needed. Therefore, even a beginner can perform focal and astigmatism adjustments. Furthermore, the focal and astigmatism adjustments of the present invention are not affected by the variable nature of the number of secondary charged particles emitted from a sample surface given a constant beam power setting. In addition, the difficulties of automatic adjustment of sample images having monotonous surfaces, thus providing little contrast, is also avoided in the focal and astigmatism adjustment methods of the present invention because the adjustments are made visually, and the most optimal image may be selected in any given situation. And, because the focal and astigmatism adjustment values are initially set with greater values (to conduct a "rough" adjustment), and then later reduced to lower values (to conduct "fine" adjustment), a quick and systematic approach to obtain the most optimal image in any given situation may be made.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

What is claimed is:

1. A method of adjusting a charged particle beam of a beam optical system for obtaining an observational image of a sample surface by scanning a charged particle beam to detect secondary charged particles given off from the sample surface, comprising:

displaying at least three images of the sample surface, a first image scanned from an initial adjusting value, a second image scanned from the initial adjusting value $+\Delta$, and a third image scanned from the initial adjusting value $-\Delta$, wherein $\Delta$ is a known predetermined value;

selecting a clearest image from among the at least three images of the sample surface;

varying the beam optical system so that the initial adjusting value is that of the clearest image;

decreasing $\Delta$ to a smaller value; and repeating the above steps of adjusting the charged particle beam of the beam optical system until an optimal image is obtained.

2. The method according to claim 1, wherein the charged particle beam of the beam optical system is adjusted by an objective lens.

3. The method according to claim 1, wherein the charged particle beam of the beam optical system is adjusted by a stigmator having adjusting amounts $\Delta S$ to be set independently in a first direction and in a second direction.

4. A focused ion beam microscope, comprising:

a focus adjusting device for adjusting a focus of an ion beam by $\pm \Delta f$, with respect to a current focal distance f;

an image memory for storing image signals of three images scanned from the current focal distance f, a focal distance of f+$\Delta f$, and a focal distance of f−$\Delta f$; and a display for displaying the three images for comparison, wherein based on a selected clearest image, adjustment is made by $\pm \Delta f$ to the current focal distance f to set a new current focal distance f to repeat selection of the clearest image until an optimal focal distance is obtained.

5. The focused ion beam microscope according to claim 4, wherein the focus adjusting device is an objective lens.

6. A focused ion beam microscope, comprising:

an astigmatism correction adjusting device for adjusting a focused ion beam for astigmatism correction by $\pm \Delta Sx$ with respect to a first position Sx in a first direction, and by $\pm \Delta Sy$ with respect to a second position Sy in a second direction;

an image memory for storing image signals of nine images scanned from the following first positions and second positions, respectively, (1) Sx, Sy,
    (2) Sx−$\Delta Sx$, Sy+$\Delta Sy$,
    (3) Sx, Sy+$\Delta Sy$,
    (4) Sx+$\Delta Sx$, Sy+$\Delta Sy$,
    (5) Sx−$\Delta Sx$, Sy,
    (6) Sx+$\Delta Sx$, Sy,
    (7) Sx−$\Delta Sx$, Sy−$\Delta Sy$,
    (8) Sx, Sy−$\Delta Sy$,
    (9) Sx+$\Delta Sx$, Sy−$\Delta Sy$; and a display for displaying the nine images for comparison, wherein based on a selected most even and clearest image, adjustment is made by$\pm \Delta Sx$ in the first direction and $\pm \Delta Sy$ in the second direction, respectively, to the first position Sx and the second position Sy to repeat selection of the most even and clearest image until an optimal first position and an optimal second position for reducing astigmatism is obtained.

7. The focus ion beam apparatus microscope according to claim 6, wherein the astigmatism correction adjusting device is a stigmator.

* * * * *